United States Patent [19]
DeVolpi et al.

[11] 3,952,253
[45] Apr. 20, 1976

[54] METHOD AND MEANS FOR GENERATING A SYNCHRONIZING PULSE FROM A REPETITIVE WAVE OF VARYING FREQUENCY

[75] Inventors: Alexander DeVolpi, Lisle; Ronald J. Pecina, Westchester; Dale J. Travis, Lockport, all of Ill.

[73] Assignee: The United States of America as represented by the United States Energy Research and Development Administration, Washington, D.C.

[22] Filed: Nov. 21, 1974

[21] Appl. No.: 526,039

[52] U.S. Cl.................... 328/63; 328/60; 328/61; 328/140; 307/241; 307/269; 307/271; 354/50
[51] Int. Cl.²........................... H03K 1/17
[58] Field of Search............ 328/63, 67, 60, 61, 328/140, 131; 307/241, 242, 269, 271; 352/85; 354/50

[56] References Cited
UNITED STATES PATENTS

| | | | |
|---|---|---|---|
| 3,597,539 | 8/1971 | Clark | 328/63 |
| 3,671,873 | 6/1972 | Haas | 307/269 |
| 3,675,047 | 7/1972 | Bayne et al. | 307/269 |
| 3,698,806 | 10/1972 | Reitz, Jr. | 352/85 |
| 3,714,470 | 1/1973 | Goldberg | 307/271 |
| 3,789,307 | 1/1974 | Clark | 328/63 |
| 3,805,167 | 4/1974 | Nash | 328/61 |
| 3,824,608 | 7/1974 | Toyoda et al. | 328/131 |

*Primary Examiner*—Saxfield Chatmon, Jr.
*Attorney, Agent, or Firm*—Dean E. Carlson; Arthur A. Churm; Donald P. Reynolds

[57] ABSTRACT

An event that occurs repetitively at continuously changing frequencies can be used to generate a triggering pulse which is used to synchronize or control. The triggering pulse is generated at a predetermined percentage of the period of the repetitive waveform without regard to frequency. Counts are accumulated in two counters, the first counting during the "on" fraction of the period, and the second counting during the "off" fraction. The counts accumulated during each cycle are compared. On equality the trigger pulse is generated. Count input rates to each counter are determined by the ratio of the on-off fractions of the event waveform and the desired phase relationship. This invention is of particular utility in providing a trigger or synchronizing pulse during the open period of the shutter of a high-speed framing camera during its acceleration as well as its period of substantially constant speed.

5 Claims, 4 Drawing Figures

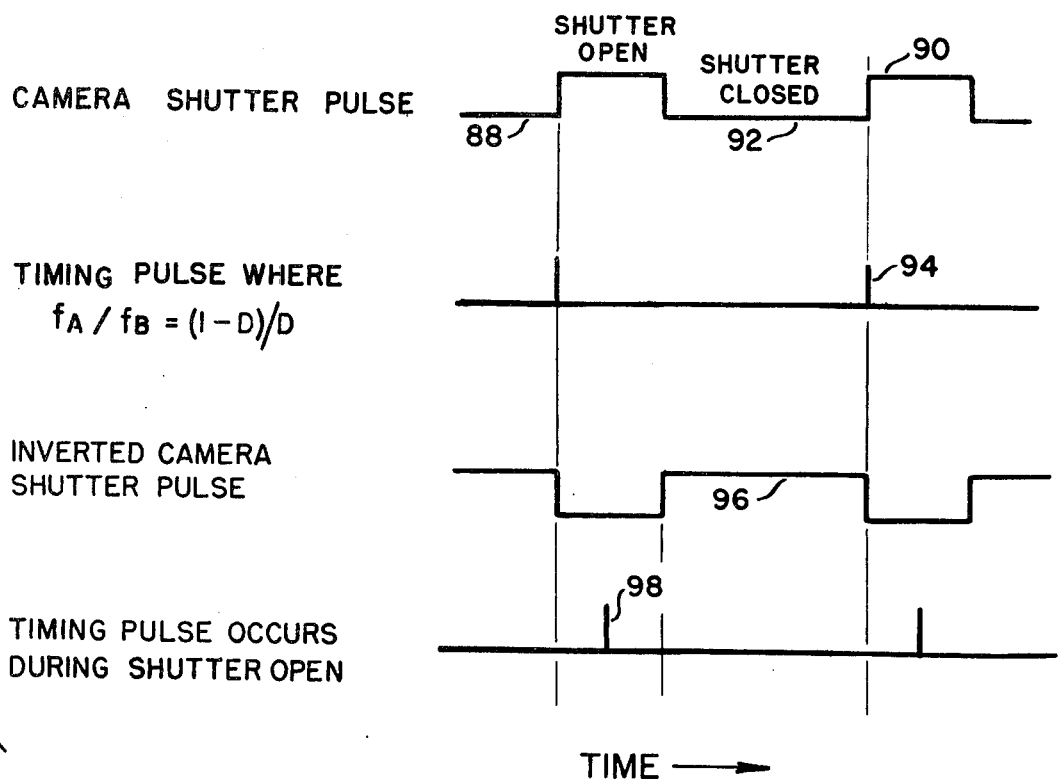

METHOD AND MEANS FOR GENERATING A SYNCHRONIZING PULSE FROM A REPETITIVE WAVE OF VARYING FREQUENCY

CONTRACTUAL ORIGIN OF THE INVENTION

The invention described herein was made in the course of, or under, a contract with the UNITED STATES ATOMIC ENERGY COMMISSION.

BACKGROUND OF THE INVENTION

This invention relates to the generation of synchronizing pulses timed to a particular portion of a waveform having a constant duty cycle over a continuously varying range of frequencies. In particular, it is useful to trigger an event to be photographed during the open period of the shutter of a high-speed framing camera during the period that the camera is accelerating as well as during periods which vary about its controlled speed.

The high-speed framing camera is a well-known device used to make photographs of events that occur very rapidly. Such cameras are commercially available with framing speeds as high as 10,000 pictures per second. In order to obtain light levels that permit adequate photography at such speeds, it is frequently desirable to obtain a trigger pulse synchronized with the camera that permits either the triggering of an event to be photographed or the triggering of a strobe lamp. When the framing camera has achieved a constant or nearly constant speed, synchronization is not a particularly difficult problem. A nominally rectangular wave is normally generated by either a magnetic or an optical pickoff associated with the shutter-driving mechanism. A magnetic pickoff may sense special paramagnetic or ferromagnetic screws in a rotating shutter, generating an output consisting of a rectangular wave form associated with passage of the magnetic screw past a coil. An optical pickoff is frequently used in which a light beam is chopped by a portion of a rotating shutter to generate a rectangular wave. In each case, the result after reshaping through a Schmitt trigger is a substantially rectangular wave of a fixed duty cycle at a frequency equal to the picture framing rate. If the camera is operating at a constant speed, synchronization is a simple matter of shaping the output pulse and delaying it to time a strobe lamp or a triggered event into the open period of the shutter.

The instant invention was developed to obtain photographs of information recorded on a hodoscope. The particular hodoscope in question included an array of 720 neon bulbs, some of which were to be switched on during the period when the camera shutter was open. These lamps are flashed on for 150 microseconds. The camera that was used was run at speeds up to 5000 frames per second, so that the corresponding period of the shutter cycle was 200 microseconds. In this camera, a shutter restricts light transmission to approximately 80 microseconds out of the 200 microseconds at 5000 frames per second. This duty cycle remained constant when the camera was being accelerated from a stop to the rate of 5000 frames per second, but the open period of the shutter was extended proportionately at lower speeds.

Attempts to use a constant delay from the camera shutter pulse to trigger the hodoscope in this application were marginally effective at high speeds and totally ineffective during the period of acceleration of the camera. It was found that film was sometimes inadequately exposed at fast framing rates. It was also found necessary to set the delay for each run and to make a test run prior to each run in order to be sure that the delay was proper for the speed being used. The test run required exposing a test film and developing the film to assure that the exposure was adequate.

It is an object of the present invention to provide a method and means of generating a synchronizing pulse that is located at a fixed relative position in a repetitive waveform.

It is a further object of the present invention to provide a method and means of generating a synchronizing pulse occurring during the same relative position in a repetitive wave form over a range of frequencies.

It is a further object of the present invention to provide a method and means of shaping the triggering output from a high-speed framing camera to generate a triggering pulse during the open period of the camera shutter.

It is a further object of the present invention to provide a method and means of generating a triggering pulse to permit the photographing of events with a high-speed framing camera during acceleration and constant-speed operation of the high-speed framing camera.

It is a further object of the present invention to provide a method and means to locate an event at a fixed fractional location in the period of a repetitive waveform by multiplying the time period of the repetitive waveform by a constant.

Other objects will become apparent in the course of a detailed description of the invention.

BRIEF DESCRIPTION OF THE DRAWINGS

FIG. 4 is a set of output and operating waveforms.

DETAILED DESCRIPTION OF THE PREFERRED EMBODIMENT

Figure 1:
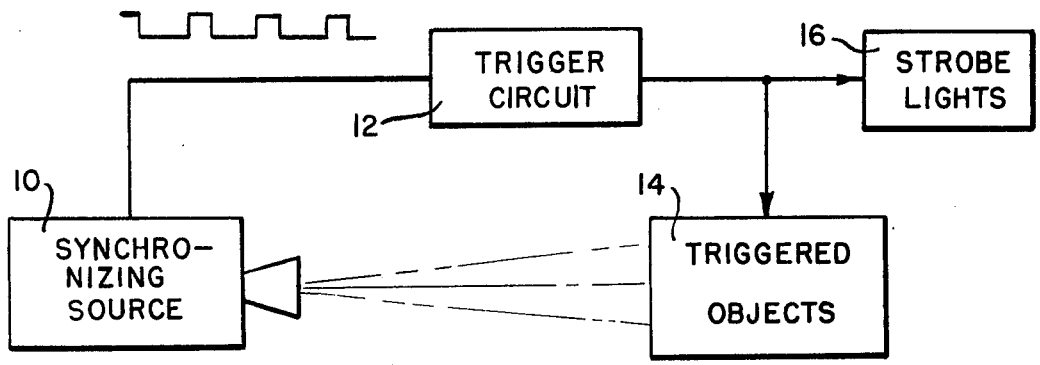
FIG. 1 is a functional block diagram of a high-speed framing camera using a trigger circuit according to the present invention to photograph objects at high speed.

FIG. 1 is a block diagram of a circuit illustrating the need for and the placement of the trigger circuit of the present invention. In FIG. 1, synchronizing source 10 is a source of a synchronizing pulse. For example, it may be a high-speed framing camera such as a HYCAM or other commercially available high-speed framing camera adapted for photography of rapidly changing events. Such cameras are normally constructed to generate an output electrical signal timed to the shutter of the camera. Such an output signal is coupled in FIG. 1 to trigger circuit 12 for processing according to the principles of the present invention. The output of trigger circuit 12 is here shown coupled to a triggered object 14 and to strobe lights 16. Triggered object 14 may be a device such as a hodoscope which supplies its own light when triggered. In this case, strobe lights 16 are unnecessary. Alternatively, a high-speed camera used as a synchronizing source 10 may be used to photograph events that are not capable of being triggered. In this case, strobe light 16 must be triggered to provide light for a proper exposure during the time the shutter of camera 10 is open.

Figure 2:
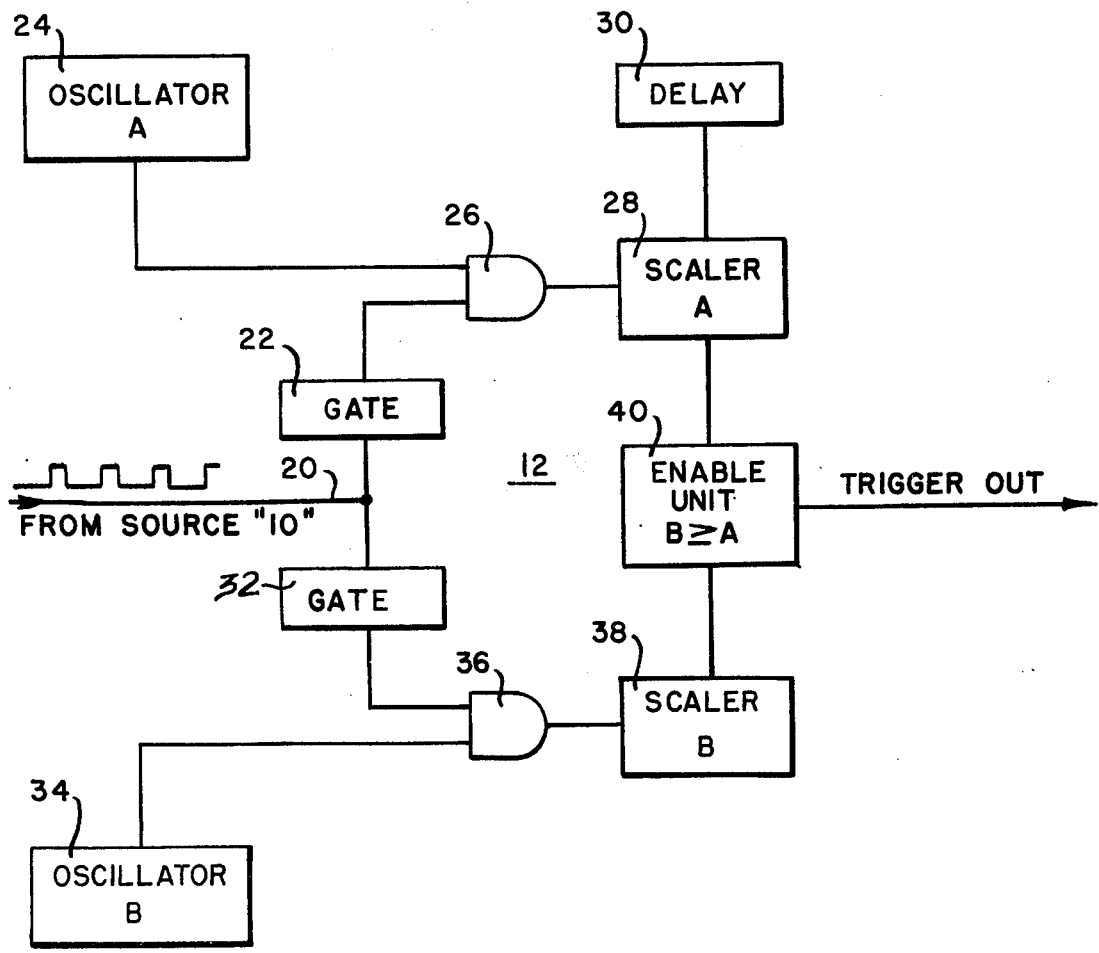
FIG. 2 is a functional block diagram of trigger circuit 12 of FIG. 1.

Further understanding of the operation of trigger circuit 12 of FIG. 1 may be had from FIG. 2 which is a functional block diagram of trigger circuit 12. In FIG. 2, line 20 receives the rectangular pulse associated with rotation of a rotating shutter in the camera of synchronizing source 10. This is thus a pulse that has a fixed duty cycle and a frequency that is the same as the frequency of the shutter of camera 10 in FIG. 1. Gate 22 is adapted to pass the rectangular pulse on its higher portion. The output of gate 22 and the output of oscillator 24 are connected as inputs to AND gate 26, which thus generates an output to scaler 28 when a signal is passed through gate 22. The result is that a sequence of pulses at the frequency of oscillator 24 is applied to scaler 28 whenever a high signal is passed through gate 22. Oscillator 24 is set to a frequency higher than the highest expected frequency of the rectangular pulse. An adjustable delay 30 applies an added count to scaler 28 which is combined in scaler 28 with the output of AND gate 26 to provide a precise location of the eventual output signal from trigger circuit 12. When the input signal from camera 10 drops to the lower level, gate 22 no longer passes the signal and scaler 28 stops counting. Gate 32 is then enabled by the lower portion of the rectangular pulse, and the signal passing through gate 32 is applied together with a signal from oscillator 34 to AND gate 36. A sequence of pulses at the frequency of oscillator 34 is thus applied to scaler 38 when gate 32 passes a signal. The outputs from scaler 28 and scaler 38 are applied to enable unit 40 which generates no output until the input from scaler 38 is equal to or greater than the input from scaler 28. When this equality is achieved or exceeded, an output pulse is generated which is the desired delayed trigger pulse. The sequence of operation of trigger circuit 12 is as follows. Beginning with the rise of the input pulse, gate 22 is on and gate 32 is off. Scaler 28 counts at the rate set by the frequency of oscillator 24. Scaler 38 is inactive during this portion of the cycle. When the pulse from camera 10 drops to a low level, scaler A stops counting and gate 32 is enabled. This causes scaler B to begin counting at the frequency of oscillator B. When the count on scaler B equals the count on scaler A, enable unit 40 generates an output that is the desired trigger.

Figure 3:
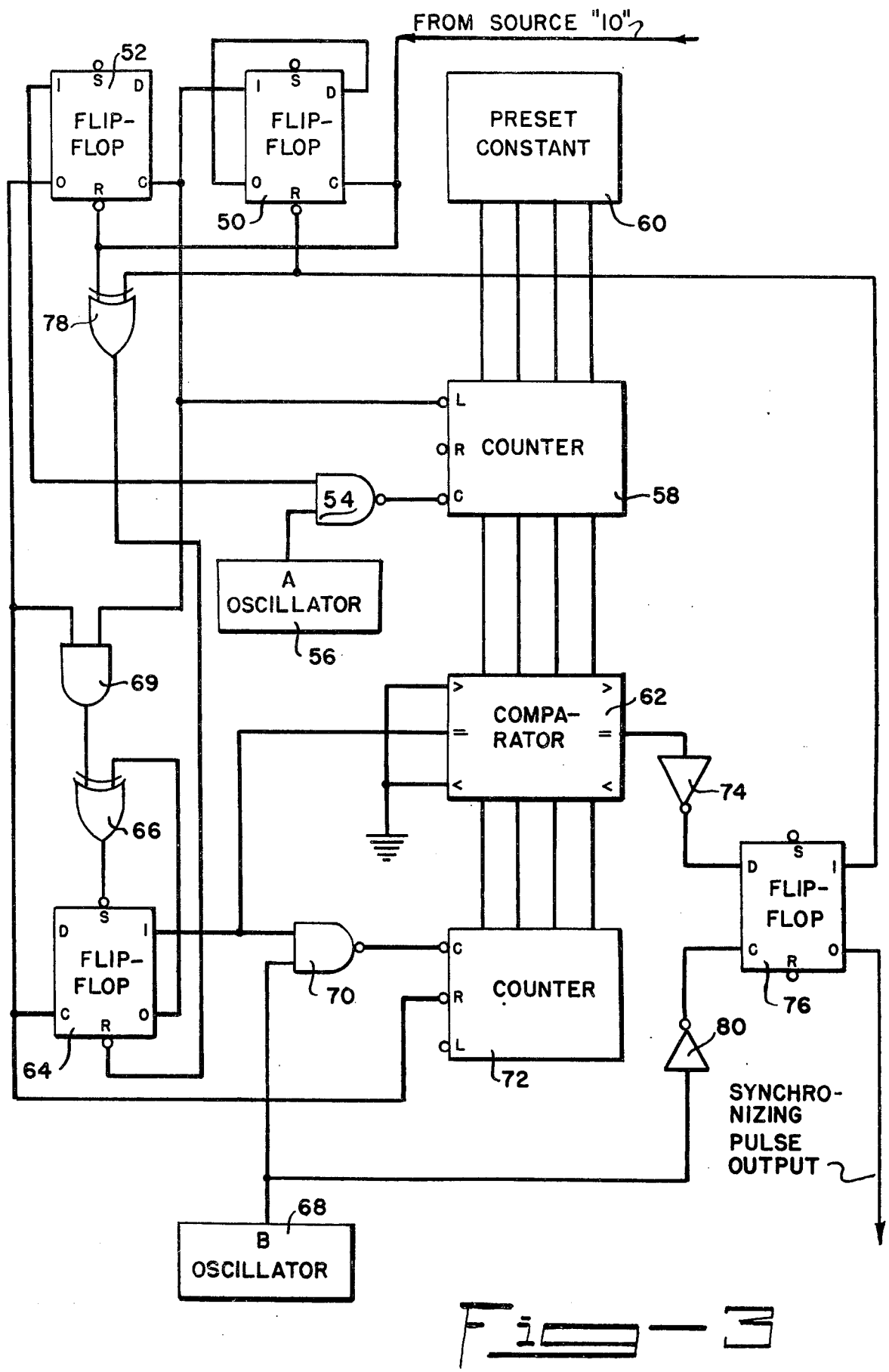
FIG. 3 is a circuit layout diagram of an operable trigger circuit according to the principles of the present invention.

An electronic circuit embodying the principles of the present invention is shown in FIG. 3, in which a rectangular pulse from camera 10 enters the clock terminal of flip-flop 50. The high output of flip-flop 50 is connected to the clock input to flip-flop 52 to provide a gate for the A oscillator. This is accomplished by connecting the high terminal of flip-flop 52 to a terminal of NAND gate 54. A oscillator 56 is also connected to a terminal of NAND gate 54. A osicllator 56 is a square wave generator set to oscillate at a frequency that is at least several times the highest framing rate of the camera to be synchronized. The output of NAND gate 54 is connected to counter 58, a 12-bit counter. This counter is enabled by a high output from flip-flop 50 and is caused in the presence of such a signal to count the pulses generated by the A oscillator. Preset constant 60 is also connected to counter 58 to provide an initial value of counts representing a desired amount of delay in the trigger pulse. Thus, when the input signal from camera 10 is high, counter 58 begins to count from the value of the preset constant 60 and accumulates a count at the frequency of A oscillator 56 for as long as the input signal from camera 10 is high. The output of counter 58 is coupled to comparator 62 for continuous comparison with a second chain of signals which will now be described. When the input signal from camera 10 to flip-flop 50 changes in polarity to a low value, NAND gate 54 is disabled, stopping the count of counter 58. At the same time, flip-flop 64 has been placed in a set condition by an input from EXCLUSIVE-OR 66 during the period when the A counter is counting. The signal received by EXCLUSIVE-OR 66 is gated by AND gate 68 on the outputs of flip-flops 50 and 52. The result is that flip-flop 64 is reset during the period that counter 58 is counting pulses from the A osicllator. When the pulse from camera 10 changes to the negative value and stops the count of the A oscillator, the count from B oscillator 68 is gated through NAND gate 70 with the output of flip-flop 64 to supply an input to B counter 72 which has previously been reset during the period of A counter operation by a signal taken from flip-flop 52. With A counter 58 holding at its high count, B counter 72 beings to count at the frequency of B oscillator 68. The output of B counter 72 is coupled to comparator 62 which generates no output as long as the count on counter 58 exceeds the count on B counter 72. When the counts become equal, the comparator 62 generates an output on the equal line which is coupled through inverter 74 to set flip-flop 76. This setting generates the desired camera synchronization pulse. The output of flip-flop 76 also resets flip-flop 50 and resets flip-flop 64 through EXCLUSIVE-OR 78. A clock pulse for flip-flop 76 is obtained from B oscillator 68 through inverter 80.

In operation, it is generally convenient to fix the frequency of A oscillator 56 in a range that is within the limits of the 12-bit counter at the slowest camera speed for which synchronization is desired. B oscillator 68 is then adjusted in frequency so that the ratio of the frequency of the A oscillator to that of the B oscillator is the ratio of the low portion to the high portion of the input waveform from camera 10. Put differently, the ratio of the frequency of B oscillator 56 to the sums of the frequencies of A oscillator 56 and B oscillator 68 is the duty cycle of the waveform from camera 10. The reason for this will now be made evident as follows.

Let the total number of counts stored in scaler A be $C_A$ and the frequency of oscillator A be $f_A$. Similarly, for oscillator B, we have $C_B$ and $f_B$. Let the instantaneous period of the camera shutter be t. This is described as an instantaneous figure because it is desired that the figure be applicable during acceleration of the camera, at which time $t$ is constantly changing. Call the time duration of the high portion of the camera pulse $t_A$ and of the low portion $t_B$. The total number of counts at frequency A is $C_A = f_A t_A$ and $C_B = f_B t_B$. It is also true that $t = t_A + t_B$ and $t_A/t = D$, the duty cycle of the camera shutter. This is a function of the mechanical design of the shutter and is a constant regardless of the acceleration of the shutter. Thus, $C_A = Df_A T$ and $C_B = (1 - D)f_b t$.

The timing circuit applies electronically the constraint that $C_A = C_B$ at the moment a timing pulse is generated. Therefore, $Df_A t = (1 - D)f_B T$. We see that independently of the period of the camera shutter and hence independently of the speed of the camera shutter or its acceleration, the ratio $f_A/f_B = (1 - D)/D$. Once the two oscillators are set so that their frequencies are in this ratio, the timing pulse will be generated at the rising edge of the shutter opening (see FIG. 4b). This is a limiting condition that sets the minimum of value of $f_B$ for a selected value of $f_A$. If $f_B$ is increased, the timing pulse will occur at a fixed fraction of the shutter closed condition. To place the timing pulse at a fixed fraction of the shutter opening invert the camera shutter pulse before feeding it into trigger circuit 12. Then the B oscillator must be adjusted to a frequency to position the timing pulse to the desired fraction of the shutter opening (FIG. 4c).

In the circuit as actually constructed and indicated in FIG. 3, an additional refinement was applied to allow for the ignition time of the neon lamps used in the hodoscope that was photographed. This was a known time that was translated into a known number of cycles of the A oscillator and thus provided the value of preset constant 60. This was an additional time element which allowed placement of the synchronizing signal at a desired location in the camera signal regardless of the frequency or acceleration of the camera.

A set of waveform typical of the operation of the present invention is shown in FIG. 4. Each of these waveforms is sketched as a function of time. In FIG. 4, camera shutter pulse 88 is taken as typical of the output of the synchronizing source 10 of FIG. 1. Camera shutter pulse 88 appears to be rectangular, with an open-shutter portion 90 and a closed-shutter portion 92. It is evident that if camera shutter pulse 88 exhibits unwanted amplitude jitter or an insufficiently sharp rise, a clean pulse can readily be achieved by applying the actual camera shutter pulse to a Schmitt trigger. Timing pulse 94 is obtained from camera shutter pulse 88, or its cleaned version, if necessary. Inverted camera shutter pulse 96 is then obtained by inversion of camera shutter pulse 88 or its cleaned version. The event is then viewed during the period of shifted timing pulse 98, which is placed in the period when the camera shutter is open by the process described earlier.

A timing circuit according to the principles of the present invention has been built and has been used to photograph a hodoscope display with a high-speed framing camera at the Argonne National Laboratory. The display was an array of 720 neon bulbs which, when triggered, display the state of a particular sequence of events at the time of triggering. The events being monitored are in general capable of changing from frame to frame of the camera used which was a HYCAM high-speed framing camera that was run at speeds up to 5000 frames per second. This particular camera has a shutter disk providing a duty cycle as described above equal to 40 percent. Thus, the shutter is open for 80 microseconds out of the 200-microsecond framing time at 5000 pictures per second. Using conventional means of synchronization, the exposures were not well timed during the periods of acceleration of the camera and it was necessary to make a trial run at speed and to develop the pictures thus obtained to be sure that synchronization was proper at any given speed. The application of the instant invention to provide a triggering signal for the neon bulbs provided excellent synchronization from speeds of about 50 frames per second to the maximum value of 5000 frames per second. The electronic circuit was constructed using commercial integrated-circuit oscillators, counters, comparators, gates, Schmitt triggers, and D flip-flops. The A oscillator was set at a frequency of 0.75 MHz and the preset constant was wired to provide a fixed delay of 75 microseconds. This value was half the width of the 150-microsecond pulse used to ignite the neon lamps and was inserted to insure that the pulse bracketed the shutter opening.

The values mentioned herein were appropriate to the application in which the instant invention was used. They should not be taken to limit the invention. For example, should it be desired to maintain the same maximum framing speed but extend the synchronization to lower framing rates, it would only be necessary to add more stages to the counters 58 and 72 and to add more units to the comparator 62 of FIG. 3. If it is desired to extend the use of the circuit to higher framing rates, it is necessary only to increase the frequencies of the A and B oscillators, making sure that their ratio is maintained according to the method described. The only limit on the high frequency of the circuit is that upon the digital electronic units that are available.

The embodiments of the invention in which an exclusive property or privilege is claimed are defined as follows:

1. A method of generating a trigger pulse that is synchronized with a repetitive signal exhibiting a range of frequencies and having an on period of length $T_1$ and an off period of length $T_2$ comprising the steps of:
   generating a first counting rectangular wave at a frequency greater than the frequency of the repetitive signal;
   generating a second counting rectangular wave at a frequency that is greater than the frequency of the repetitive signal and at least equal to the product of the ratio of the on period to the off period times the frequency of the first counting rectangular wave;
   counting the cycles of the first counting wave during the period $T_1$ to obtain a first count;
   counting the cycles of the second counting wave after the end of the period $T_1$ to obtain a second count;
   comparing the first count to the second count; and
   generating a trigger pulse when the first count equals the second count,
   which trigger pulse is synchronized with the repetitive signal.

2. The method of claim 1 comprising in addition the step of adding a predetermined count to the count of number of cycles of said first counting wave to effect a predetermined time delay of said trigger pulse.

3. An apparatus for generating a trigger pulse that is synchronized to the rectangular synchronizing signal from a high-speed framing camera over a range of speeds of said high-speed framing camera, said signal having a first portion and a second portion, said apparatus comprising:
   a first oscillator;
   a second oscillator;
   a first counter connected to said first oscillator and responsive thereto to count cycles thereof during a first portion of said rectangular synchronizing signal;
   a second counter connected to said second oscillator and responsive thereto to count cycles thereof during a second portion of said rectangular synchronizing signal; and
   a comparator connected to said first and second counters and generating a trigger pulse when said counts of cycles are equal,
   which trigger pulse is synchronized to said output synchronizing signal over a range of speeds of said camera.

4. The apparatus of claim 3 comprising in addition delay means connected to one of said first and second counters to add thereto an initial count to effect a delay in the generation of the trigger pulse.

5. An apparatus for generating a pulse synchronized to and timed to a predetermined region of a rectangular wave having an on time and an off time over a range of frequencies comprising a first flip-flop receiving said rectangular wave as an input and generating a shaped rectangular wave in response thereto;

a second flip-flop coupled to said first flip-flop and responsive to said shaped rectangular wave to generate a further shaped rectangular wave in response thereto;

a first oscillator generating a first counting signal at a predetermined frequency;

a first NAND gate connected to said second flip-flop and said first oscillator and responsive to outputs therefrom to provide a first counting signal;

a first counter connected to said first NAND gate and responsive to said first counting signal to generate a count of cycles of said first oscillator;

a preset constant circuit connected to said first counter to provide as an input a predetermined initial value thereon;

a third flip-flop connected to said second flip-flop and responsive to a 0 output therefrom;

a second oscillator generating a second counting signal at a frequency that is related to the frequency of said first oscillator by a multiplicative factor equal to the ratio of on time to off time of said rectangular wave;

a first AND gate connected to the 0 output terminal of said second flip-flop and to said 1 output terminal of said first flip-flop and generating an output in response thereto;

an EXCLUSIVE-OR gate connected to the output of said first AND gate and the 0 output of said third third flip-flop at the start of the off time of said rectangular wave;

a second NAND gate connected to said second oscillator and said third flip-flop to provide a second counting signal;

a second counter connected to said second NAND gate and responsive to said second counting signal to generate a count of cycles of said second oscillator;

a comparator connected to said first and second counters and responsive thereto to generate an output signal when said counts of said first and second counters are equal;

an inverter connected to said comparator to invert the output signal thereof;

a fourth flip-flop connected to said inverter and responsive thereto to generate an output pulse, which pulse is synchronized to and timed to said predetermined region of said rectangular wave.

* * * * *